(12) United States Patent
Liu

(10) Patent No.: US 11,888,474 B2
(45) Date of Patent: Jan. 30, 2024

(54) ON DIE TERMINATION CIRCUIT AND MEMORY DEVICE

(71) Applicant: CHANGXIN MEMORY TECHNOLOGIES, INC., Anhui (CN)

(72) Inventor: ChihCheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 290 days.

(21) Appl. No.: 17/385,439

(22) Filed: Jul. 26, 2021

(65) Prior Publication Data

US 2021/0384905 A1    Dec. 9, 2021

Related U.S. Application Data

(63) Continuation of application No. PCT/CN2021/094076, filed on May 17, 2021.

(30) Foreign Application Priority Data

Jun. 3, 2020    (CN) .......................... 202010493235.4

(51) Int. Cl.
*H03K 19/00* (2006.01)
*G11C 7/10* (2006.01)

(52) U.S. Cl.
CPC ....... *H03K 19/0005* (2013.01); *G11C 7/1048* (2013.01); *G11C 7/1051* (2013.01)

(58) Field of Classification Search
CPC .............. H03K 19/0005; G11C 7/1048; G11C 7/1051; G11C 7/02
See application file for complete search history.

(56) References Cited

U.S. PATENT DOCUMENTS

| 8,327,163 | B2 | 12/2012 | Chen |
| 8,928,349 | B2 | 1/2015 | Oh |
| 9,325,318 | B1* | 4/2016 | Huang ........... H03K 19/018507 |
| 2010/0219866 | A1 | 9/2010 | Chen |

FOREIGN PATENT DOCUMENTS

| CN | 1655086 A | 8/2005 |
| CN | 1996025 A | 7/2007 |
| CN | 101119100 A | 2/2008 |
| CN | 101820277 A | 9/2010 |

OTHER PUBLICATIONS

A Versatile I/O with Robust Impedance Calibration for Various Memory Interface, IEEE International Symposium on Circuits and Systems (ISCAS), 2006, Youngin, Korea (Year: 2006).*

* cited by examiner

*Primary Examiner* — Seokjin Kim
(74) *Attorney, Agent, or Firm* — Syncoda LLC; Feng Ma

(57) ABSTRACT

An on die termination (ODT) circuit includes a signal input terminal; a grounding terminal; a first transistor including a control terminal and a first terminal which are electrically connected with the signal input terminal, and a second terminal electrically connected with the grounding terminal; and a second transistor including a control terminal electrically connected with the signal input terminal, a first terminal, and a second terminal electrically connected with the grounding terminal, and when voltage of the signal input terminal changes, the first transistor has a change trend of resistance opposite to that of the second transistor.

12 Claims, 2 Drawing Sheets

ON DIE TERMINATION CIRCUIT AND MEMORY DEVICE

CROSS-REFERENCE TO RELATED APPLICATIONS

This application is a continuation of International Application No. PCT/CN2021/094076 filed on May 17, 2021, which is claims priority to Chinese Patent Application No. 202010493235.4 filed on Jun. 3, 2020. The disclosures of these applications are hereby incorporated by reference in their entirety.

BACKGROUND

Due to the increase in capacity and operating speed of a memory device, the signal integrity is degraded. For example, as the operating speed of the memory device increases, the bandwidth of the data transmitted by a channel of a memory controller connected to the memory device may increase, which may reduce the signal quality. Therefore, an On Die Termination (ODT) circuit is used to reduce the signal noise and prevent signals from being reflected on the circuit.

SUMMARY

The disclosure relates to the field of memory devices, and more specifically to an on-die termination circuit and a memory device.

In an aspect, an on die termination (ODT) circuit is provided, including: a signal input terminal; a grounding terminal; a first transistor, including a control terminal, a first terminal and a second terminal, wherein the control terminal of the first transistor and the first terminal of the first transistor are electrically connected with the signal input terminal, and the second terminal of the first transistor is electrically connected with the grounding terminal; and a second transistor, including a control terminal, a first terminal and a second terminal, wherein the first terminal of the second transistor is electrically connected with the signal input terminal, the second terminal of the second transistor is electrically connected with the grounding terminal, and in response to a change in a voltage of the signal input terminal, a change trend of a resistance of the first transistor is opposite to a change trend of a resistance of the second transistor.

In another aspect, a memory device is provided, including an on die termination (ODT) circuit, wherein the ODT circuit includes: a signal input terminal; a grounding terminal; a first transistor, including a control terminal, a first terminal and a second terminal, wherein the control terminal of the first transistor and the first terminal of the first transistor are electrically connected with the signal input terminal, and the second terminal of the first transistor is electrically connected with the grounding terminal; and a second transistor, including a control terminal, a first terminal and a second terminal, wherein the first terminal of the second transistor is electrically connected with the signal input terminal, the second terminal of the second transistor is electrically connected with the grounding terminal, and in response to a change in a voltage of the signal input terminal, a change trend of a resistance of the first transistor is opposite to a change trend of a resistance of the second transistor.

DETAILED DESCRIPTION

For a memory device, the signal integrity can be important. Therefore, as the operating speed of the memory increases, the requirements for the ODT circuit have become very strict. For example, according to the Low Power Double Data Rate 4 (LPDDR4) specification, when the pad voltage is between 10% and 50% of the power supply voltage VDDQ, the resistance of the ODT circuit must be within a specific region.

However, the resistance of the existing ODT circuit is often unstable and cannot meet the requirements.

The particular embodiments of the ODT circuit and the memory device provided in the disclosure will be described in detail below with reference to the accompanying drawings.

Generally, for a high-speed chip, in order to ensure the integrity of transmitted signals, fluctuation of the ODT resistance value at an interface needs to be kept within a smaller range. For example, according to the LPDDR4 specification, it is required that the resistance of an ODT circuit must be within a specific region when the data bus (DQ) pad voltage is between 10% and 50% of the power supply voltage (VDDQ). That is, when the DQ pad voltage changes between 10% and 50% of VDDQ, the resistance of the ODT circuit needs to be maintained stable, so that the signal integrity of the memory device can be improved. For faster or larger-bandwidth chips such as Double Data Rate 5 (DDRS) and Low Power Double Data Rate 5 (LPDDR5), the requirements for ODT circuits may be higher. However, for ODT circuits in related technologies, the resistance of the ODT circuit is greatly affected by external factors (such as the pad voltage), is not stable enough, and cannot meet the requirements.

Therefore, the embodiments of the disclosure provide an ODT circuit. When the DQ pad voltage changes (for example, when the DQ pad voltage changes between 10% and 50% of VDDQ in some embodiments), the resistance of the ODT circuit is maintained stable, so that the signal integrity of the memory device is improved.

Figure 1:
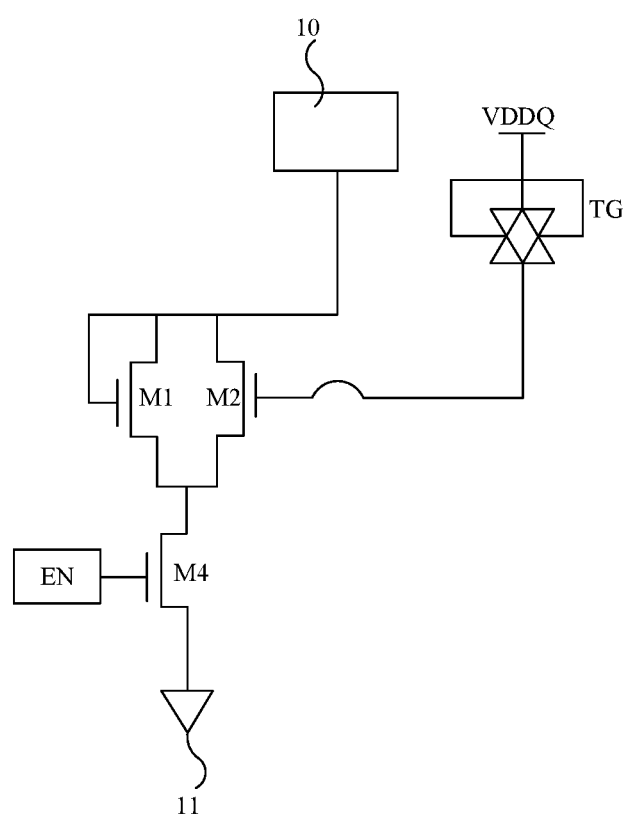
FIG. 1 illustrates a schematic diagram of a composition structure of an ODT circuit according to some embodiments of the disclosure.

FIG. 1 illustrates a schematic diagram of a composition structure of an ODT circuit provided in embodiments of the disclosure. Referring to FIG. 1, the ODT circuit provided in the embodiments of the disclosure includes a signal input terminal 10, a grounding terminal 11, a first transistor M1 and a second transistor M2.

The signal input terminal 10 is configured to receive an input signal, such as a voltage signal on a DQ pad.

The first transistor M1 includes a control terminal, a first terminal and a second terminal. The control terminal of the first transistor and the first terminal of the first transistor are electrically connected with the signal input terminal 10, and the second terminal of the first transistor is electrically connected with the grounding terminal 11. In some embodiments, the first transistor M1 is an NMOS transistor, the first terminal is a drain terminal, and the second terminal is a source terminal. In some embodiments, the first transistor M1 may also be a P-Metal-Oxide-Semiconductor (PMOS)

transistor, the first terminal of the first transistor is a drain terminal, and the second terminal of the first transistor is a source terminal.

The second transistor M2 includes a control terminal, a first terminal and a second terminal. The first terminal of the second transistor is electrically connected with the signal input terminal 10, and the second terminal of the second transistor is electrically connected with the grounding terminal 11. In some embodiments, the second transistor M2 is an NMOS transistor, the first terminal is a drain terminal, and the second terminal is a source terminal. In some embodiments, the second transistor M2 may also be a PMOS transistor, the first terminal of the second transistor is a drain terminal, and the second terminal of the second transistor is a source terminal.

It can be understood that in some embodiments of the disclosure, the first transistor M1 and the second transistor M2 have the same transistor type. For example, the first transistor M1 and the second transistor M2 are both NMOS transistors, or the first transistor M1 and the second transistor M2 are both PMOS transistors.

As the voltage of the signal input terminal 10 changes, the change trend of the resistance of the first transistor M1 is opposite to the change trend of the resistance of the second transistor M2. In some embodiments, under a same change trend of the voltage of the signal input terminal 10, if the resistance of the first transistor M1 tends to decrease, the resistance of the second transistor M2 tends to increase; and/or if the resistance of the first transistor M1 tends to increase, the resistance of the second transistor M2 tends to decrease.

In some embodiments, both the control terminal and the first terminal of the first transistor M1 are electrically connected with the signal input terminal 10. That is, the control terminal and the first terminal of the first transistor M1 are short-circuited. In such a case, the first transistor M1 works in a saturation region. The change trend of the resistance of the first transistor M1 is opposite to the change trend of the voltage of the signal input terminal 10. That is, the resistance of the first transistor M1 decreases as the voltage of the signal input terminal 10 increases, or the resistance of the first transistor M1 increases as the voltage of the signal input terminal 10 decreases.

In some embodiments, the second transistor M2 works in a linear region. The change trend of the resistance of the second transistor M2 is the same as the change trend of the voltage of the signal input terminal 10. That is, the resistance of the second transistor M2 increases as the voltage of the signal input terminal 10 increases, and/or the resistance of the second transistor M2 decreases as the voltage of the signal input terminal 10 decreases.

In some embodiments, the control terminal of the second transistor M2 is electrically connected with the power supply voltage VDDQ, and the power supply voltage VDDQ drives the second transistor M2 to be switched on. Since the power supply voltage VDDQ is basically maintained stable, the change trend of the resistance of the second transistor M2 is only related to the change trend of the voltage of the signal input terminal 10.

In some embodiments, the control terminal of the second transistor M2 is electrically connected with the power supply voltage VDDQ through a transmission gate TG. The switching-on and switching-off of the transmission gate TG control whether the control terminal of the second transistor M2 is electrically connected with the power supply voltage VDDQ, and improve the stability of the electrical connection.

In some embodiments of the disclosure, the control terminal of the second transistor M2 may also be electrically connected with the power supply voltage VDDQ through other switching units, such as NMOS transistors or PMOS transistors. If the switching unit is conducted, the control terminal of the second transistor M2 is electrically connected with the power supply voltage VDDQ. If the switching unit is switched off, the control terminal of the second transistor M2 is disconnected from the power supply voltage VDDQ.

In some embodiments, the change trend of the resistance of the first transistor M1 is opposite to the change trend of the voltage of the signal input terminal 10, and the change trend of the resistance of the second transistor M2 is the same as the change trend of the voltage of the signal input terminal 10. It can be understood that in some embodiments of the disclosure, the change trend of the resistance of the first transistor M1 may be the same as the change trend of the voltage of the signal input terminal 10, and the change trend of the resistance of the second transistor M2 may be opposite to the change trend of the voltage of the signal input terminal 10, thereby meeting the requirement that as the voltage of the signal input terminal 10 changes, the change trend of the resistance of the first transistor M1 is opposite to the change trend of the resistance of the second transistor M2.

In some embodiments, the second terminal of the first transistor M1 and the second terminal of the second transistor M2 are electrically connected with the grounding terminal 11 through an enabling unit M4 rather than directly electrically connected with the grounding terminal 11. The enabling unit M4 is switched on or switched off according to a control signal so as to control connection or disconnection of the second terminal of the first transistor M1 and the second terminal of the second transistor M2 with/from the grounding terminal 11.

In some embodiments, the enabling unit M4 is an NMOS transistor. A control terminal of the NMOS transistor is electrically connected with a control module. A drain terminal of the NMOS transistor is electrically connected with the second terminal of the first transistor M1 and the second terminal of the second transistor M2. A source terminal of the NMOS transistor is electrically connected with the grounding terminal 11. The control terminal of the NMOS transistor drives the NMOS transistor to be switched on or switched off according to a control signal EN sent by the control module, thereby controlling the connection or disconnection of the second terminal of the first transistor M1 and the second terminal of the second transistor M2 with/from the grounding terminal 11. In some other embodiments of the disclosure, the enabling unit M4 may also be a PMOS transistor, and a control terminal of the PMOS transistor drives the PMOS transistor to be switched on or switched off according to a control signal EN sent by the control module, thereby controlling the connection or disconnection of the second terminal of the first transistor M1 and the second terminal of the second transistor M2 with/from the grounding terminal 11.

In the embodiments of the disclosure, as the voltage of the signal input terminal 10 changes, the change trend of the resistance of the first transistor M1 is opposite to the change trend of the resistance of the second transistor M2. No matter the voltage of the signal input terminal 10 increases or decreases, the resistance changes of the first transistor M1 and the second transistor M2 are complementary to each other. In this way, the resistance changes of the first transistor M1 and the second transistor M2 can be approximately counteracted, and the resistance of the ODT circuit is always maintained within a preset numerical range. The resistance of the ODT circuit has high stability, and thus, the signal integrity of the memory device is improved.

When implementing the embodiments of the disclosure, the inventor found that the resistance of the ODT circuit may fall out of the preset numerical range in some situations. After research, the inventor found that the reasons for this case are: as the voltage of the signal input terminal 10 changes, the change amplitude of the resistance of the second transistor M2 is greater than the change amplitude of the resistance of the first transistor M1, which makes the resistance change of the first transistor M1 unable to counteract the resistance change of the second transistor M2. Thus, the resistance of the ODT circuit increases or decreases and is not maintained within the preset numerical range.

Figure 2:
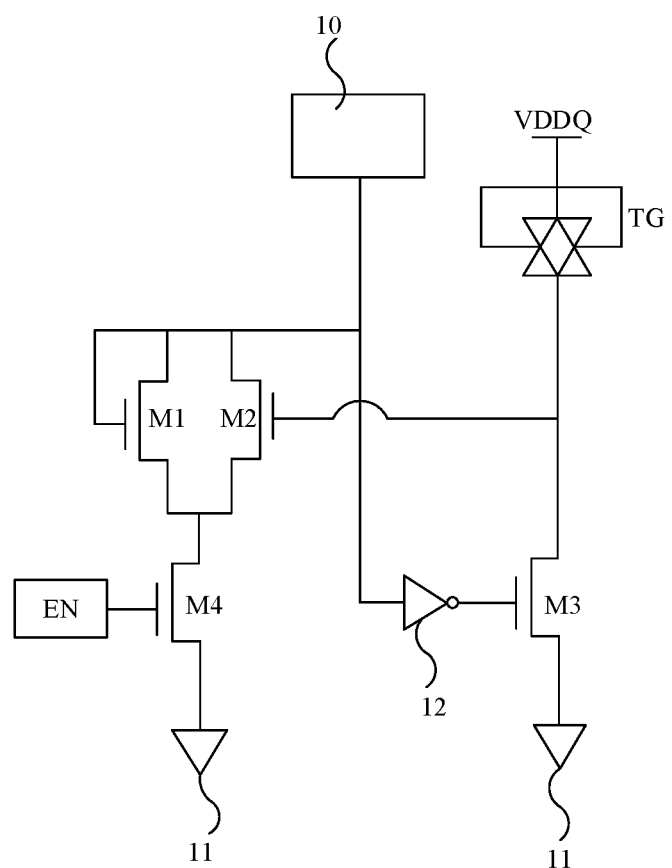
FIG. 2 illustrates a schematic diagram of a composition structure of an ODT circuit according to some embodiments of the disclosure.

Based on the above, the embodiments of the disclosure provide an ODT circuit which can slow down the change trend of the resistance of the second transistor M2. The change amplitude of the resistance of the second transistor M2 is reduced, so that the resistance of the ODT circuit is maintained within a preset numerical range. FIG. 2 illustrates a schematic diagram of a composition structure of an ODT circuit provided in embodiments of the disclosure. Referring to FIG. 2, in the embodiments of the disclosure, the control terminal of the second transistor M2 is not only connected with the power supply voltage VDDQ, but also connected with the signal input terminal 10 through an inverter 12 and a third transistor M3. The signal input terminal 10 and the power supply voltage VDDQ together control the control terminal of the second transistor M2. Detailed descriptions are as follows:

The ODT circuit includes an inverter 12 and a third transistor M3.

The inverter 12 has an input terminal and an output terminal. The input terminal is electrically connected with the signal input terminal 10, and the output terminal is electrically connected with the control terminal of the third transistor M3.

The third transistor M3 has a control terminal, a first terminal and a second terminal. The control terminal of the third transistor is electrically connected with the output terminal of the inverter 12, the first terminal of the third transistor is electrically connected with the control terminal of the second transistor M2, and the second terminal of the third transistor is electrically connected with the grounding terminal 11. The change trend of the voltage of the signal input terminal 10 is transmitted to the control terminal of the second transistor M2 through the inverter 12 and the third transistor M3. Therefore, the voltage of the control terminal of the second transistor M2 shows the same change trend as the voltage of the signal input terminal 10.

In the embodiments of the disclosure, the change trend of the resistance of the second transistor M2 is opposite to the change trend of the voltage of the control terminal of the second transistor M2, and is the same as the change trend of the voltage of the signal input terminal 10, so that the change trend of the resistance of the second transistor M2 can be slowed down, the change amplitude of the resistance of the second transistor M2 can be reduced, the change amplitude of the resistance of the second transistor M2 tends to be equal to the change amplitude of the resistance of the first transistor M1, the change of the resistance of the first transistor M1 can approximately counteract the change of the resistance of the second transistor M2, and thus, the resistance of the ODT circuit is maintained within the preset numerical range.

For example, if the voltage of the signal input terminal 10 has a change trend of decreasing, after the voltage of the signal input terminal 10 is transmitted to the control terminal of the second transistor M2 through the inverter 12 and the third transistor M3, the voltage of the control terminal of the second transistor M2 has a change trend of decreasing, and the resistance of the second transistor M2 has a change trend of increasing. Since the signal input terminal 10 is electrically connected with the first terminal of the second transistor M2, the change trend of the voltage of the first terminal of the second transistor M2 is the same as the change trend of the voltage of the signal input terminal 10. That is, the voltage of the first terminal of the second transistor M2 also has a change trend of decreasing. Under the synergistic effect of the voltage change trend of the control terminal and the first terminal of the second transistor M2, the resistance of the second transistor M2 not only has the same change trend as the voltage of the signal input terminal 10, but also has a change amplitude reduced compared with the condition that the control terminal of the second transistor M2 is only connected with the power supply voltage VDDQ. Thus, the change amplitude of the resistance of the second transistor M2 tends to be equal to the change amplitude of the resistance of the first transistor M1, and the change of the resistance of the first transistor M1 can approximately counteract the change of the resistance of the second transistor M2. Thus, the resistance of the ODT circuit is maintained within the preset numerical range.

For example, if the voltage of the signal input terminal 10 has a change trend of increasing, after the voltage of the signal input terminal 10 is transmitted to the control terminal of the second transistor M2 through the inverter 12 and the third transistor M3, the voltage of the control terminal of the second transistor M2 has a change trend of increasing, and the resistance of the second transistor M2 has a change trend of decreasing. Since the signal input terminal 10 is electrically connected with the first terminal of the second transistor M2, the voltage of the first terminal of the second transistor M2 has the same change trend as the voltage of the signal input terminal 10. That is, the voltage of the first terminal of the second transistor M2 also has a change trend of increasing. Under the synergistic effect of the voltage change trend of the control terminal and the first terminal of the second transistor M2, the resistance of the second transistor M2 not only has the same change trend as the voltage of the signal input terminal 10, but also has a change amplitude reduced compared with the condition that the control terminal of the second transistor M2 is only connected with the power supply voltage VDDQ. Thus, the change amplitude of the resistance of the second transistor M2 tends to be equal to the change amplitude of the resistance of the first transistor M1, and the change of the resistance of the first transistor M1 can approximately counteract the change of the resistance of the second transistor M2. Thus, the resistance of the ODT circuit is maintained within the preset numerical range.

In some embodiments, the third transistor M3 is an NMOS transistor. In some other embodiments of the disclosure, the third transistor M3 may also be a PMOS transistor. It can be understood that in some embodiments of the disclosure, the third transistor M3 and the second transistor M2 have the same transistor type. For example, the third transistor M3 and the second transistor M2 are both NMOS transistors, or the third transistor M3 and the second transistor M2 are both PMOS transistors.

The foregoing is only an exemplary embodiment for slowing down the change trend of the resistance of the second transistor M2 provided in the embodiments of the disclosure. It can be understood that other methods that can achieve this effect are also feasible, which is not limited in the embodiments of the disclosure.

The embodiments of the disclosure further provide a memory device. The memory device includes the ODT circuit of any one of the above embodiments. The resistance of the ODT circuit is maintained within a preset numerical range as the voltage of the signal input terminal changes, and the resistance of the ODT circuit has high stability. Thus, the memory device provided in the embodiments of the disclosure has higher signal integrity, and the storage property of the memory device is greatly improved.

The above embodiments are only exemplary embodiments of the disclosure. It should be noted that those skilled in the art can make improvements and modifications without departing from the principles of the disclosure, which should also be regarded as within the protection scope of the disclosure.

An ODT circuit and a memory device are provided in the disclosure. The ODT circuit includes: a signal input terminal, a grounding terminal, a first transistor, and a second transistor. The first transistor includes a control terminal, a first terminal and a second terminal. The control terminal of the first transistor and the first terminal of the first transistor are electrically connected with the signal input terminal, and the second terminal of the first transistor is electrically connected with the grounding terminal. The second transistor includes a control terminal, a first terminal and a second terminal. The first terminal of the second transistor is electrically connected with the signal input terminal, and the second terminal of the second transistor is electrically connected with the grounding terminal. In response to a change in a voltage of the signal input terminal, a change trend of a resistance of the first transistor is opposite to a change trend of a resistance of the second transistor. The ODT circuit provided in the embodiments of the disclosure is applied to the memory device. During operating the memory device, when the voltage of the signal input terminal changes, the resistance of the ODT circuit is always maintained within a numerical range. The resistance of the ODT circuit has high stability, and the signal integrity of the memory device can be improved. Thus, the storage property of the memory device can be improved.

What is claimed is:

1. An on die termination (ODT) circuit, comprising:
a signal input terminal;
a grounding terminal;
a first transistor, comprising a control terminal, a first terminal and a second terminal, wherein the control terminal of the first transistor and the first terminal of the first transistor are electrically connected with the signal input terminal, and the second terminal of the first transistor is electrically connected with the grounding terminal; and
a second transistor, comprising a control terminal, a first terminal and a second terminal, wherein the first terminal of the second transistor is electrically connected with the signal input terminal, the second terminal of the second transistor is electrically connected with the grounding terminal, and in response to a change in a voltage of the signal input terminal, a change trend of a resistance of the first transistor is opposite to a change trend of a resistance of the second transistor;
wherein:
the first transistor works in a saturation region, and the change trend of the resistance of the first transistor is at least one of following: the resistance of the first transistor decreases as the voltage of the signal input terminal increases, or the resistance of the first transistor increases as the voltage of the signal input terminal decreases; and
the second transistor works in a linear region, and the change trend of the resistance of the second transistor is at least one of following: the resistance of the second transistor increases as the voltage of the signal input terminal increases, or the resistance of the second transistor decreases as the voltage of the signal input terminal decreases.

2. The ODT circuit of claim 1, wherein the control terminal of the second transistor is electrically connected with a power supply voltage.

3. The ODT circuit of claim 2, wherein the control terminal of the second transistor is electrically connected with the power supply voltage through a transmission gate.

4. The ODT circuit of claim 2, further comprising:
an inverter having an input terminal and an output terminal, wherein the input terminal is electrically connected with the signal input terminal; and
a third transistor having a control terminal, a first terminal and a second terminal, wherein the control terminal of the third transistor is electrically connected with the output terminal of the inverter, the first terminal of the third transistor is electrically connected with the control terminal of the second transistor, and the second terminal of the third transistor is electrically connected with the grounding terminal.

5. The ODT circuit of claim 1, wherein the second terminal of the first transistor and the second terminal of the second transistor are electrically connected with the grounding terminal through an enabling element, and the enabling element is switched on or switched off according to a control signal so as to control connection of the second terminals of the first transistor and the second transistor with the grounding terminal, or disconnection of the second terminals of the first transistor and the second transistor from the grounding terminal.

6. The ODT circuit of claim 5, wherein the enabling element is an N-metal-oxide-semiconductor (NMOS) transistor.

7. A memory device, comprising an on die termination (ODT) circuit, wherein the ODT circuit comprises:
a signal input terminal;
a grounding terminal;
a first transistor, comprising a control terminal, a first terminal and a second terminal, wherein the control terminal of the first transistor and the first terminal of the first transistor are electrically connected with the signal input terminal, and the second terminal of the first transistor is electrically connected with the grounding terminal; and
a second transistor, comprising a control terminal, a first terminal and a second terminal, wherein the first terminal of the second transistor is electrically connected with the signal input terminal, the second terminal of the second transistor is electrically connected with the grounding terminal, and in response to a change in a voltage of the signal input terminal, a change trend of a resistance of the first transistor is opposite to a change trend of a resistance of the second transistor;

wherein:

the first transistor works in a saturation region, and the change trend of the resistance of the first transistor is at least one of following: the resistance of the first transistor decreases as the voltage of the signal input terminal increases, or the resistance of the first transistor increases as the voltage of the signal input terminal decreases; and the second transistor works in a linear region, and the change trend of the resistance of the second transistor is at least one of following: the resistance of the second transistor increases as the voltage of the signal input terminal increases, or the resistance of the second transistor decreases as the voltage of the signal input terminal decreases.

8. The memory device of claim 7, wherein the control terminal of the second transistor is electrically connected with a power supply voltage.

9. The memory device of claim 8, wherein the control terminal of the second transistor is electrically connected with the power supply voltage through a transmission gate.

10. The memory device of claim 8, wherein the ODT circuit further comprises:

an inverter having an input terminal and an output terminal, wherein the input terminal is electrically connected with the signal input terminal; and a third transistor having a control terminal, a first terminal and a second terminal, wherein the control terminal of the third transistor is electrically connected with the output terminal of the inverter, the first terminal of the third transistor is electrically connected with the control terminal of the second transistor, and the second terminal of the third transistor is electrically connected with the grounding terminal.

11. The memory device of claim 7, wherein the second terminal of the first transistor and the second terminal of the second transistor are electrically connected with the grounding terminal through an enabling element, and the enabling element is switched on or switched off according to a control signal so as to control connection of the second terminals of the first transistor and the second transistor with the grounding terminal, or disconnection of the second terminals of the first transistor and the second transistor from the grounding terminal.

12. The memory device of claim 11, wherein the enabling element is an N-metal-oxide-semiconductor (NMOS) transistor.

* * * * *